US011482996B2

(12) United States Patent
Sakamoto et al.

(10) Patent No.: US 11,482,996 B2
(45) Date of Patent: Oct. 25, 2022

(54) CIRCUIT DEVICE

(71) Applicant: SEIKO EPSON CORPORATION, Tokyo (JP)

(72) Inventors: Yoshifumi Sakamoto, Chino (JP); Motoaki Nishimura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/392,685

(22) Filed: Aug. 3, 2021

(65) Prior Publication Data

US 2022/0045678 A1 Feb. 10, 2022

(30) Foreign Application Priority Data

Aug. 5, 2020 (JP) ............................ JP2020-132949

(51) Int. Cl.
*H03K 3/00* (2006.01)
*H03K 17/00* (2006.01)
*H03K 17/16* (2006.01)
*H03K 17/687* (2006.01)
*H03K 19/20* (2006.01)

(52) U.S. Cl.
CPC .......... *H03K 17/687* (2013.01); *H03K 19/20* (2013.01)

(58) Field of Classification Search
None
See application file for complete search history.

(56) References Cited

U.S. PATENT DOCUMENTS 6,545,513 B2 * 4/2003 Tsuchida .............. H03K 17/166 327/108
8,350,601 B2 * 1/2013 Nagata ................. H03K 17/168 327/108
11,211,927 B2 * 12/2021 Sugie ................. H03K 17/6214
2009/0237126 A1 * 9/2009 Chen ................ H03K 17/08122 327/109

FOREIGN PATENT DOCUMENTS

DE 42 19 790 3/1994
JP 02-072745 3/1990
JP 06-097784 4/1994

* cited by examiner

*Primary Examiner* — Kenneth B Wells
(74) *Attorney, Agent, or Firm* — Rankin, Hill & Clark LLP

(57) ABSTRACT

A circuit device includes an output terminal, an output transistor, and a gate voltage control circuit. The output transistor is provided between a first power supply node and the output terminal. The gate voltage control circuit changes a gate voltage of the output transistor at a first temporal voltage change rate after an input signal changes from a first logic level to a second logic level, changes the gate voltage at a second temporal voltage change rate smaller than the first temporal voltage change rate after the gate voltage reaches a first determination voltage, and changes the gate voltage at a third temporal voltage change rate greater than the second temporal voltage change rate after the gate voltage reaches a second determination voltage.

19 Claims, 7 Drawing Sheets

120 GATE VOLTAGE CONTROL CIRCUIT
130 VOLTAGE GENERATION CIRCUIT
140 SWITCH CONTROL CIRCUIT
100
Vsup VSS Va Vb Vc TX Vgate
VSS NVSS V7 N7 V6 N6 V5 N5 V4 N4 V3 N3 V2 N2 V1 N1
CSW1 CSW2 CSW3 CSW4 CSW5 CSW6 CSW7 CSW8
SW1 SW2 SW3 SW4 SW5 SW6 SW7 SW8
RA8 RA7 RA6 RA5 RA4 RA3 RA2 RA1
CA
115 NVsup DD1 SQ TQ DD2 110 NVSS VSS 100
GATE VOLTAGE CONTROL CIRCUIT
VOLTAGE GENERATION CIRCUIT
130
SWITCH CONTROL CIRCUIT
140
120
TX
Vsup
VSS
NVsup
NVSS
115
DD1
DD2
110
SQ
TQ
Vgate
CA
N1
N2
N3
N4
N5
N6
N7
V1
V2
V3
V4
V5
V6
V7
SW1
SW2
SW3
SW4
SW5
SW6
SW7
SW8
RA1
RA2
RA3
RA4
RA5
RA6
RA7
RA8
CSW1
CSW2
CSW3
CSW4
CSW5
CSW6
CSW7
CSW8
Va
Vb
Vc

CIRCUIT DEVICE

The present application is based on, and claims priority from JP Application Serial Number 2020-132949, filed Aug. 5, 2020, the disclosure of which is hereby incorporated by reference herein in its entirety.

BACKGROUND

1. Technical Field

The present disclosure relates to a circuit device.

2. Related Art

JP-A-6-97784 discloses a pulse forming configuration unit for forming a rectangular pulse. The pulse forming configuration unit includes a signal edge generator to which the rectangular pulse is supplied, and an operational amplifier and an output amplification stage which receive an output signal of the signal edge generator. An output signal of the output amplification stage is output to an output terminal, and the output signal is fed back to the operational amplifier. The signal edge generator generates, from the rectangular pulse, a pulse having a state transition unit with a slowed rise, fall, and roundness. The signal edge generator charges an internal capacitor with a constant current, discharges the internal capacitor to obtain a falling edge, and limits an efficiency of a current source and a sink to round a signal waveform.

As described above, JP-A-6-97784 simply describes a configuration of the signal edge generator which rounds the signal waveform, and does not disclose a specific configuration such as under what conditions the waveform is changed.

SUMMARY

An aspect of the present disclosure relates to a circuit device. The circuit device includes an output terminal, an output transistor provided between a first power supply node to which a first power supply voltage is supplied and the output terminal, and a gate voltage control circuit configured to control a gate voltage of the output transistor based on an input signal, the gate voltage, a first determination voltage, and a second determination voltage higher than the first determination voltage. The gate voltage control circuit changes the gate voltage at a first temporal voltage change rate after the input signal changes from a first logic level to a second logic level, changes the gate voltage at a second temporal voltage change rate smaller than the first temporal voltage change rate after the gate voltage reaches the first determination voltage, and changes the gate voltage at a third temporal voltage change rate greater than the second temporal voltage change rate after the gate voltage reaches the second determination voltage.

DESCRIPTION OF EXEMPLARY EMBODIMENTS

Hereinafter, a preferred embodiment of the present disclosure will be described in detail. The present embodiment to be described below does not unduly limit contents described in the appended claims, and all configurations described in the present embodiment are not necessarily essential constituent elements.

1. Circuit Device

Figure 1:
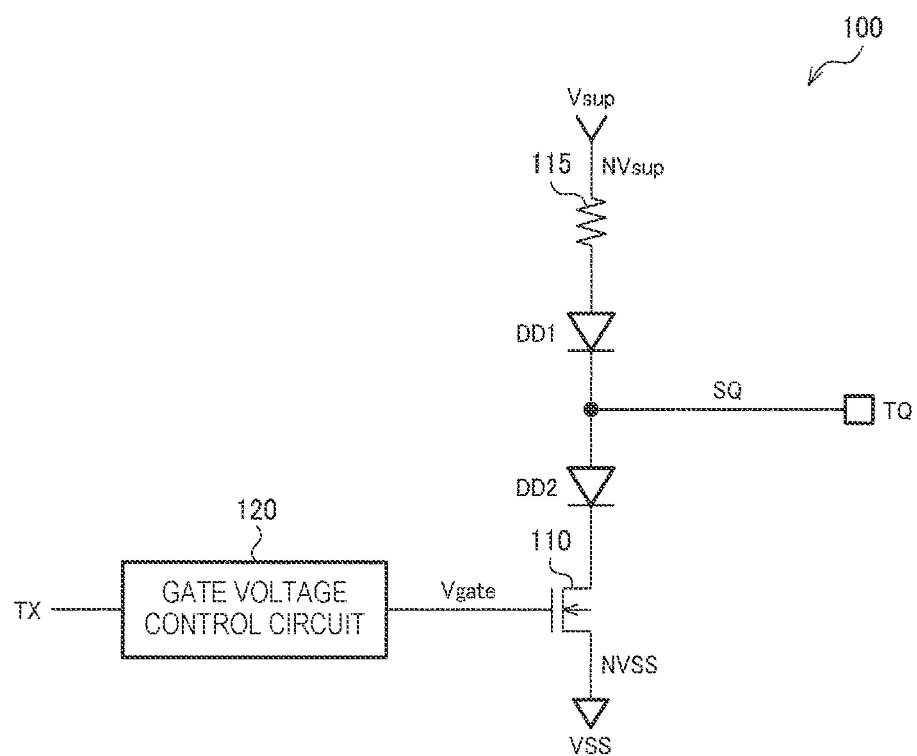
FIG. 1 is a configuration example of a circuit device.

FIG. 1 is a configuration example of a circuit device 100. The circuit device 100 includes an output transistor 110, an output resistor 115, a gate voltage control circuit 120, diodes DD1 and DD2, and an output terminal TQ. The circuit device 100 is implemented by, for example, a semiconductor device. The semiconductor device is an integrated circuit device in which circuit elements are integrated on a semiconductor substrate. At this time, the output terminal TQ is a pad formed at the semiconductor substrate or a terminal provided in a package of the semiconductor device.

The gate voltage control circuit 120 generates a gate voltage Vgate by forming a waveform of an input signal TX, which is a rectangular wave digital signal. At this time, the waveform forming is controlled by monitoring the gate voltage Vgate. The output transistor 110 and the output resistor 115 constitute an output circuit, and the output circuit outputs an output signal SQ to the output terminal TQ based on the gate voltage Vgate. The diodes DD1 and DD2 are provided as protection elements, and are specifically provided to prevent a backflow. The output circuit is, for example, an output circuit of an LIN standard which is an in-vehicle network standard, and a use of the output circuit is not limited to the LIN. LIN is an abbreviation for local interconnect network.

The output transistor 110 is provided between the output terminal TQ and a first power supply node NVSS to which a first power supply voltage VSS is supplied. Specifically, the output transistor 110 is an N-type transistor. A source of the output transistor 110 is coupled to the first power supply node NVSS, and a drain thereof is coupled to a cathode of the diode DD2. An anode of the diode DD2 is coupled to the output terminal TQ. The first power supply voltage VSS is a voltage lower than a second power supply voltage Vsup supplied to a second power supply node NVsup. The first power supply voltage VSS is, for example, a ground voltage. The first power supply voltage VSS and the second power supply voltage Vsup are supplied, for example, from an outside of the circuit device 100 to the circuit device 100, and may be supplied from a power supply circuit built in the circuit device 100.

The output resistor 115 is provided between the second power supply node NVsup and the output terminal TQ. Specifically, one end of the output resistor 115 is coupled to the second power supply node NVsup, and the other end thereof is coupled to an anode of the diode DD1. A cathode of the diode DD1 is coupled to the output terminal TQ.

Figure 2:
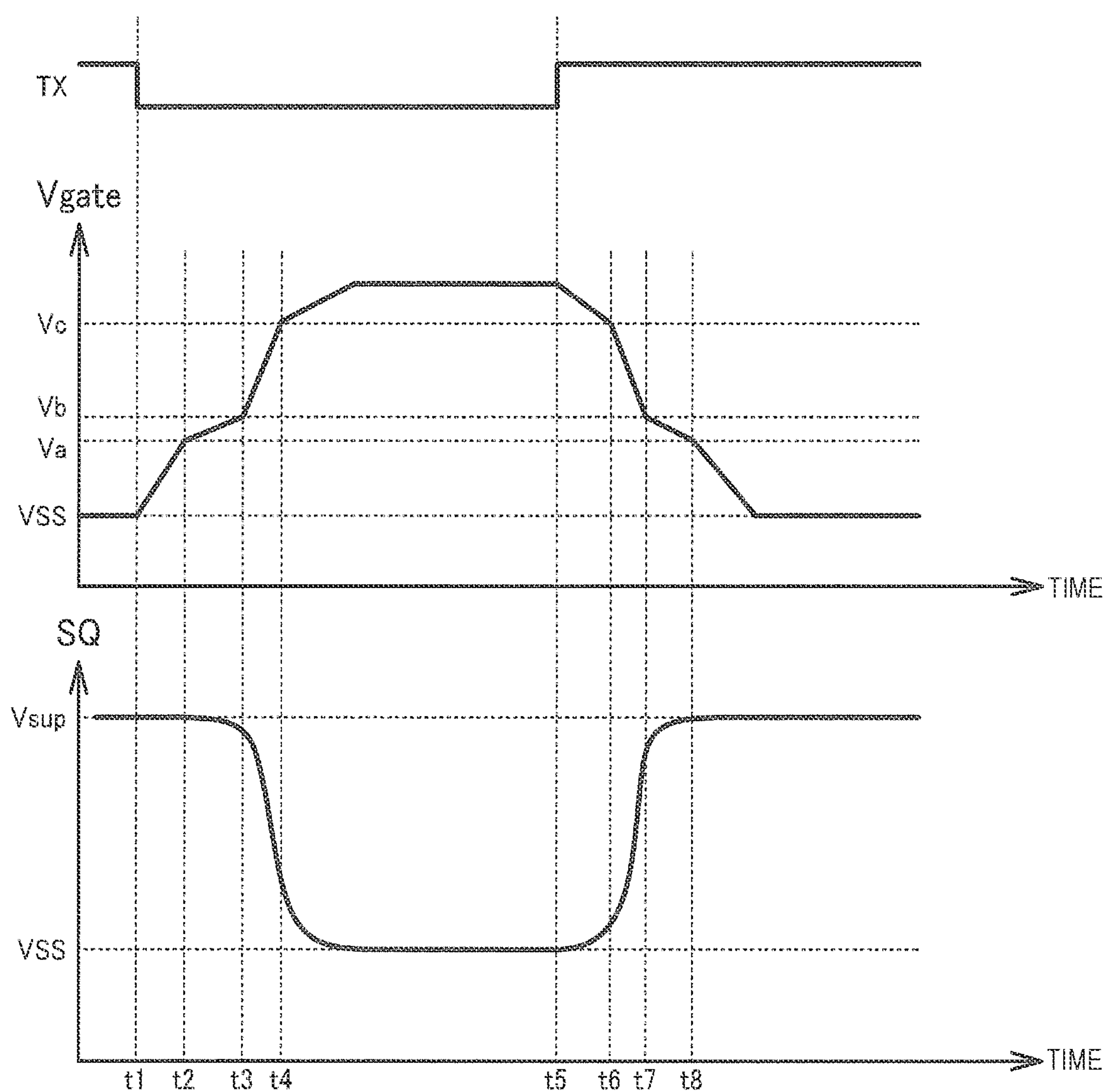
FIG. 2 is a waveform diagram showing an operation of the circuit device.

FIG. 2 is a waveform diagram showing an operation of the circuit device 100. The gate voltage control circuit 120 receives the input signal TX and controls the gate voltage Vgate of the output transistor 110. Specifically, the gate voltage control circuit 120 compares the gate voltage Vgate with a determination voltage, and controls the gate voltage Vgate based on a comparison result and the input signal TX, thereby outputting the output signal SQ corresponding to the input signal TX to the output terminal TQ. More specifically, the gate voltage control circuit 120 changes the gate voltage Vgate at a first temporal voltage change rate after the input signal TX transitions from a high level to a low level. After the gate voltage Vgate reaches a first determination voltage Va, the gate voltage control circuit 120 changes the gate voltage Vgate at a second temporal voltage change rate smaller than the first temporal voltage change rate. After the gate voltage Vgate reaches a second determination voltage Vb higher than the first determination voltage Va, the gate voltage control circuit 120 changes the gate voltage Vgate at a third temporal voltage change rate greater than the second temporal voltage change rate.

A timing at which the input signal TX changes from the high level to the low level is defined as t1, and a timing at which the gate voltage Vgate reaches the first determination voltage Va is defined as t2. The gate voltage control circuit 120 changes the gate voltage Vgate at the first temporal voltage change rate in a period from the timing t1 to the timing t2. When a timing at which the gate voltage Vgate reaches the second determination voltage Vb is defined as t3, the gate voltage control circuit 120 changes the gate voltage Vgate at the second temporal voltage change rate in a period from the timing t2 to the timing t3. The gate voltage control circuit 120 changes the gate voltage Vgate at the third temporal voltage change rate in a period from the timing t3 to a timing t4 to be described later.

A temporal voltage change rate is a change in a voltage with respect to a temporal change. That is, the temporal voltage change rate corresponds to a slope of a waveform of the gate voltage Vgate in FIG. 2 or a time derivative of the gate voltage Vgate. The first temporal voltage change rate to the third temporal voltage change rate are positive change rates. Further, in the input signal TX of FIG. 2, a logic level before the timing t1 is set as a first logic level, and a logic level from the timing t1 to a timing t5 is set as a second logic level. In FIG. 2, the first logic level is a high level and the second logic level is a low level, and the first logic level may be the low level and the second logic level may be the high level.

According to the present embodiment, in the period from the timing t2 at which the gate voltage Vgate reaches the first determination voltage Va to the timing t3 at which the gate voltage Vgate reaches the second determination voltage Vb, the gate voltage control circuit 120 changes the gate voltage Vgate at the second temporal voltage change rate which is smaller than the first temporal voltage change rate and smaller than the third temporal voltage change rate. Accordingly, this makes it possible to round a corner at which falling of the output signal SQ is started.

Specifically, the first determination voltage Va and the second determination voltage Vb are set in the vicinity of a threshold voltage of the output transistor 110 as to be described later with reference to FIG. 5 and the like. When the gate voltage Vgate is in the vicinity of the threshold voltage, the falling of the output signal SQ is started, and at this time, the gate voltage Vgate changes at the gentle second temporal voltage change rate. Accordingly, the temporal voltage change rate of the output signal SQ is small when the falling of the output signal SQ is started, and the corner at which the falling is started is rounded.

As described above, in the present embodiment, the gate voltage control circuit 120 monitors the gate voltage Vgate, so that the waveform of the gate voltage Vgate in the vicinity of the threshold voltage of the output transistor 110 can be controlled, and effective waveform forming can be performed accordingly. When the corner of the output signal SQ is rounded, for example, noise radiated from a signal line through which the output signal SQ is transmitted is reduced.

Next, a method of rounding a corner at which the falling of the output signal SQ is ended will be described. After the gate voltage Vgate reaches a third determination voltage Vc higher than the second determination voltage Vb, the gate voltage control circuit 120 changes the gate voltage Vgate at a fourth temporal voltage change rate smaller than the third temporal voltage change rate. The fourth temporal voltage change rate is a positive change rate.

When a timing at which the gate voltage Vgate reaches the third determination voltage Vc is defined as t4, the gate voltage control circuit 120 changes the gate voltage Vgate at the fourth temporal voltage change rate after the timing t4. After the gate voltage Vgate reaches a predetermined voltage, the gate voltage Vgate is maintained at the predetermined voltage until the timing t5 at which the input signal TX changes from the low level to the high level. As will be described later with reference to FIG. 5 and the like, the predetermined voltage is a fourth gate drive voltage V4 which is higher than the third determination voltage Vc.

According to the present embodiment, after the timing t4 at which the gate voltage Vgate reaches the third determination voltage Vc, the gate voltage control circuit 120 changes the gate voltage Vgate at the fourth temporal voltage change rate smaller than the third temporal voltage change rate. When the output signal SQ reaches the first power supply voltage VSS, the falling of the output signal SQ is ended, and according to the present embodiment, at the timing t4 at which the output signal SQ approaches the first power supply voltage VSS, the temporal voltage change rate of the gate voltage Vgate becomes the gentle fourth temporal voltage change rate. Accordingly, when the output signal SQ approaches the first power supply voltage VSS, the temporal voltage change rate of the output signal SQ is small, and the corner at which the falling is ended is rounded.

The gate voltage control circuit 120 rounds the corners at which the rising of the output signal SQ is started and ended by the same method as described above.

Specifically, the gate voltage control circuit 120 changes the gate voltage Vgate at a fifth temporal voltage change rate after the input signal TX changes from the low level to the high level. After the gate voltage Vgate reaches the third determination voltage Vc, the gate voltage control circuit 120 changes the gate voltage Vgate at a sixth temporal voltage change rate. After the gate voltage Vgate reaches the second determination voltage Vb, the gate voltage control circuit 120 changes the gate voltage Vgate at a seventh temporal voltage change rate. After the gate voltage Vgate reaches the first determination voltage Va, the gate voltage control circuit 120 changes the gate voltage Vgate at an eighth temporal voltage change rate. The seventh temporal voltage change rate is smaller than the eighth temporal voltage change rate. The sixth temporal voltage change rate is greater than the seventh temporal voltage change rate. The fifth temporal voltage change rate is smaller than the sixth temporal voltage change rate. The fifth to eighth temporal voltage change rates are negative change rates, and a magnitude relationship described above means a magnitude relationship in absolute values.

According to the present embodiment, the output signal SQ starts to rise at the timing t5, and the temporal voltage change rate of the gate voltage Vgate is the gentle fifth temporal voltage change rate. Accordingly, the temporal voltage change rate of the output signal SQ is small, and a corner at which the rising is started is rounded. When the gate voltage Vgate is in the vicinity of the threshold voltage, the rising of the output signal SQ is to be ended, and at this time, the gate voltage Vgate changes at the gentle seventh temporal voltage change rate. Accordingly, the temporal voltage change rate of the output signal SQ is small when the rising of the output signal SQ is ended, and the corner at which the rising is ended is rounded.

2. Detailed Configuration Example

Figure 3:
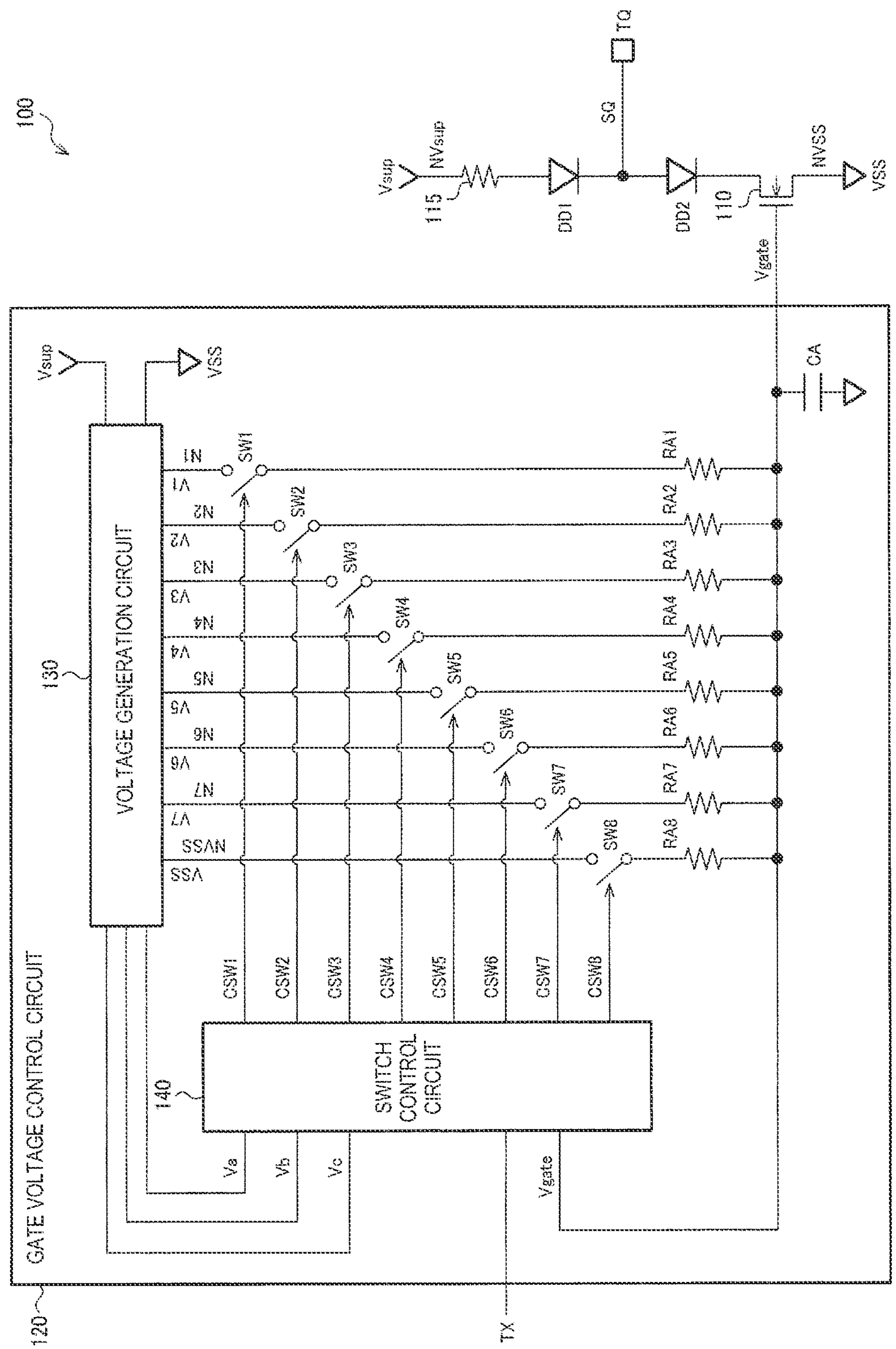
FIG. 3 is a detailed configuration example of a gate voltage control circuit.

FIG. 3 shows a detailed configuration example of the gate voltage control circuit 120. The gate voltage control circuit 120 includes a voltage generation circuit 130, a switch control circuit 140, a first switch SW1 to a seventh switch SW7, a first power supply switch SW8, a first resistor RA1 to a seventh resistor RA7, a first power supply resistor RA8, and a capacitor CA. Hereinafter, these switches and resistors are abbreviated and referred to as the switches SW1 to SW8 and the resistors RA1 to RA8.

The voltage generation circuit 130 generates the first determination voltage Va, the second determination voltage Vb, and the third determination voltage Vc, and outputs them to the switch control circuit 140. Further, the voltage generation circuit 130 generates a first gate drive voltage V1 to a seventh gate drive voltage V7, and outputs the first gate drive voltage V1 to the seventh gate drive voltage V7 to a first node N1 to a seventh node N7.

The switch SW1 and the resistor RA1 are coupled in series between the first node N1 and a gate of the output transistor 110. Specifically, one end of the switch SW1 is coupled to the first node N1, and the other end is coupled to one end of the resistor RA1. The other end of the resistor RA1 is coupled to the gate of the output transistor 110. Similarly, the switches SW2 to SW7 and the resistors RA2 to RA7 are coupled in series between the second to seventh nodes N2 to N7 and the gate of the output transistor 110. The switch SW8 and the resistor RA8 are coupled between the first power supply node NVSS and the gate of the output transistor 110. The switches SW1 to SW8 are formed by transistors. Each of the switches SW1 to SW8 may be, for example, a P-type transistor or an N-type transistor, or may be a transfer gate in which a P-type transistor and an N-type transistor are coupled in parallel.

One end of the capacitor CA is coupled to the gate of the output transistor 110, and the other end is coupled to the first power supply node NVSS.

The switch control circuit 140 controls the switches SW1 to SW8 to be turned on or off based on the input signal TX, the gate voltage Vgate of the output transistor 110, the first determination voltage Va, the second determination voltage Vb, and the third determination voltage Vc. Specifically, the switch control circuit 140 compares the gate voltage Vgate with the first determination voltage Va, the second determination voltage Vb, and the third determination voltage Vc to determine whether the gate voltage Vgate reaches the first determination voltage Va, the second determination voltage Vb, and the third determination voltage Vc. Then, the switch control circuit 140 turns on or off the switches SW1 to SW8 by outputting control signals CSW1 to CSW8 based on a determination result thereof and a logic level of the input signal TX. The switch control circuit 140 turns on any one of the switches SW1 to SW8 and turns off the other switches.

For example, when the switch control circuit 140 turns on the switch SW1, the first gate drive voltage V1 is output to the gate of the output transistor 110 via the resistor RA1, and the capacitor CA is charged. At this time, a charge speed of the capacitor CA, that is, the temporal voltage change rate of the gate voltage Vgate is determined by the first gate drive voltage V1 and a resistance value of the resistor RA1. The temporal voltage change rate of the gate voltage Vgate can be controlled depending on which of the switches SW1 to SW8 is turned on by the switch control circuit 140, and the waveform forming as shown in FIG. 2 can be performed.

Figure 4:
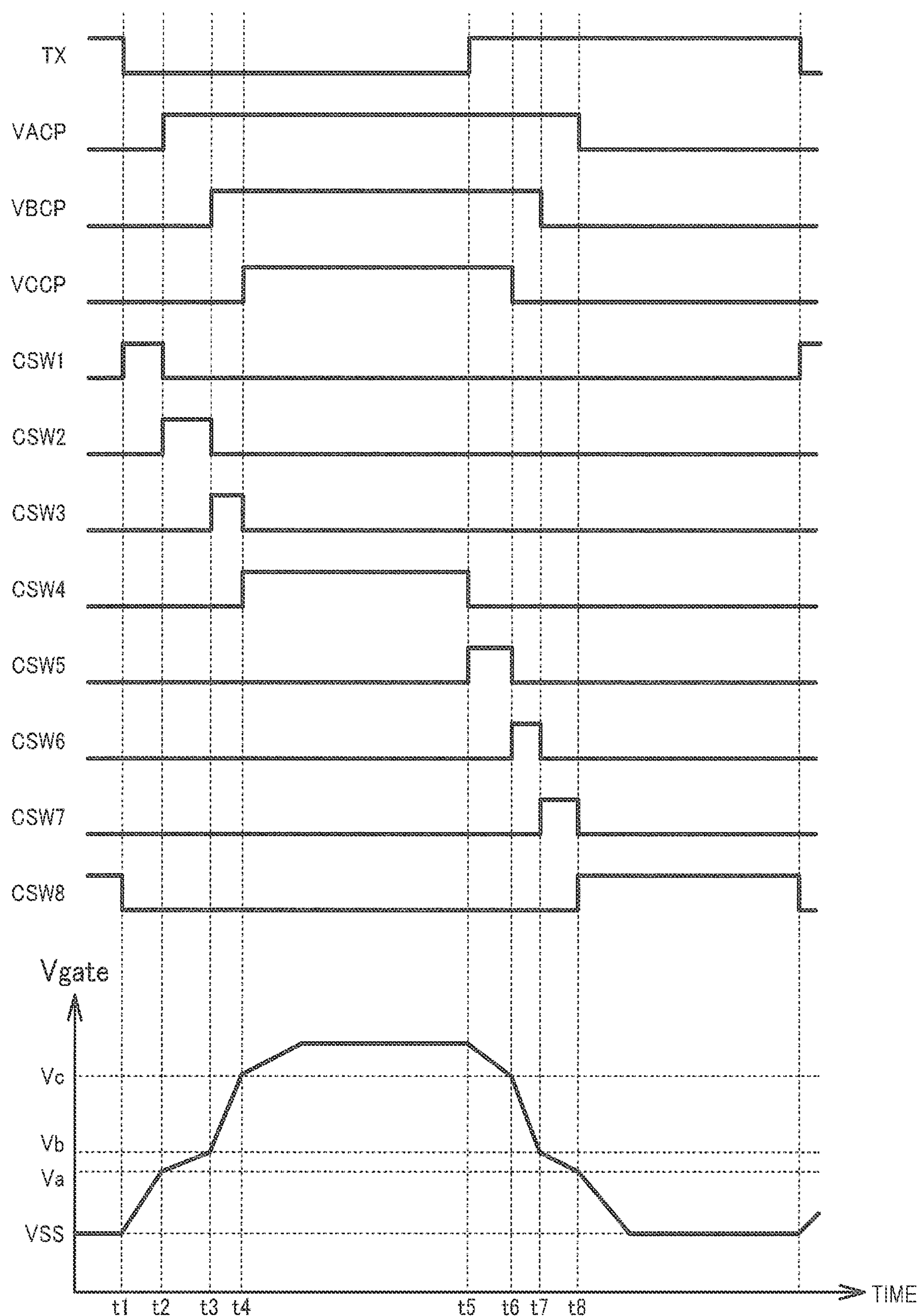
FIG. 4 is a waveform diagram showing an operation of the gate voltage control circuit.

FIG. 4 is a waveform diagram showing an operation of the gate voltage control circuit 120. Here, when the control signals CSW1 to CSW8 are at the high level, the switches SW1 to SW8 are turned on. A VACP is a determination signal of a comparator 141 which compares the first determination voltage Va with the gate voltage Vgate, a VBCP is a determination signal of a comparator 142 which compares the second determination voltage Vb with the gate voltage Vgate, and a VCCP is a determination signal of a comparator 143 which compares the third determination voltage Vc with the gate voltage Vgate. The comparators 141 to 143 will be described later with reference to FIG. 6. The comparators 141 to 143 output the high level when the gate voltage Vgate is higher than the Va to the Vc.

The switch control circuit 140 sets the control signal CSW1 to the high level to turn on the switch SW1 in a period from the timing t1 at which the input signal TX changes from the high level to the low level to a timing t2 at which the determination signal VACP changes from the low level to the high level. At this time, the gate voltage Vgate changes at the first temporal voltage change rate determined by the first gate drive voltage V1 and the resistance value of the resistor RA1.

Next, the switch control circuit 140 sets the control signal CSW2 to the high level to turn on the switch SW2 in a period from the timing t2 to a timing t3 at which the determination signal VBCP changes from the low level to the high level. At this time, the gate voltage Vgate changes at the second temporal voltage change rate determined by the second gate drive voltage V2 and a resistance value of the resistor RA2.

Next, the switch control circuit 140 sets the control signal CSW3 to the high level to turn on the switch SW3 in a period from the timing t3 to a timing t4 at which the determination signal VCCP changes from the low level to the high level. At this time, the gate voltage Vgate changes at the third temporal voltage change rate determined by the third gate drive voltage V3 and a resistance value of the resistor RA3.

Next, the switch control circuit 140 sets the control signal CSW4 to the high level to turn on the switch SW4 in a period from the timing t4 to the timing t5 at which the input signal TX changes from the low level to the high level. At this time, the gate voltage Vgate changes at the fourth temporal voltage change rate determined by the fourth gate drive voltage V4 and a resistance value of the resistor RA4.

The resistance values of the resistors RA1 to RA4 have the following magnitude relationship. The resistance value of the resistor RA2 is greater than the resistance value of the resistor RA1, the resistance value of the resistor RA3 is smaller than the resistance value of the resistor RA2, and the resistance value of the resistor RA4 is greater than the resistance value of the resistor RA3. Accordingly, the second temporal voltage change rate is smaller than the first temporal voltage change rate, the third temporal voltage change rate is greater than the second temporal voltage change rate, and the fourth temporal voltage change rate is smaller than the third temporal voltage change rate. As described with reference to FIG. 2, since the second temporal voltage change rate and the fourth temporal voltage change rate are small, the corners at which the falling of the output signal SQ is started and ended are rounded. Further, since the third temporal voltage change rate is large, the falling of the output signal SQ becomes steep.

Next, the switch control circuit 140 sets the control signal CSW5 to the high level to turn on the switch SW5 in a period from the timing t5 at which the input signal TX changes from the low level to the high level to a timing t6 at which the determination signal VCCP changes from the high level to the low level. At this time, the gate voltage Vgate changes at the fifth temporal voltage change rate determined by the fifth gate drive voltage V5 and a resistance value of the resistor RA5.

Next, the switch control circuit 140 sets the control signal CSW6 to the high level to turn on the switch SW6 in a period from the timing t6 to a timing t7 at which the determination signal VBCP changes from the high level to the low level. At this time, the gate voltage Vgate changes at the sixth temporal voltage change rate determined by the sixth gate drive voltage V6 and a resistance value of the resistor RA6.

Next, the switch control circuit 140 sets the control signal CSW7 to the high level to turn on the switch SW7 in the period from the timing t7 to a timing t8 at which the determination signal VACP changes from the high level to the low level. At this time, the gate voltage Vgate changes at the seventh temporal voltage change rate determined by the seventh gate drive voltage V7 and a resistance value of the resistor RA7.

Next, the switch control circuit 140 sets the control signal CSW8 to the high level to turn on the switch SW8 in a period from the timing t8 to a timing at which the input signal TX changes from the high level to the low level. At this time, the gate voltage Vgate changes at the eighth temporal voltage change rate determined by the first power supply voltage VSS and a resistance value of the resistor RA8.

The resistance values of the resistors RA5 to RA8 have the following magnitude relationship. The resistance value of the resistor RA7 is greater than the resistance value of the resistor RA8, the resistance value of the resistor RA6 is smaller than the resistance value of the resistor RA7, and the resistance value of the resistor RA5 is greater than the resistance value of the resistor RA6. Accordingly, the seventh temporal voltage change rate is smaller than the eighth temporal voltage change rate, the sixth temporal voltage change rate is greater than the seventh temporal voltage change rate, and the fifth temporal voltage change rate is smaller than the sixth temporal voltage change rate. As described with reference to FIG. 2, since the fifth temporal voltage change rate and the seventh temporal voltage change rate are small, the corners at which the rising of the output signal SQ is started and ended are rounded. Further, since the sixth temporal voltage change rate is large, the rising of the output signal SQ becomes steep.

Figure 5:
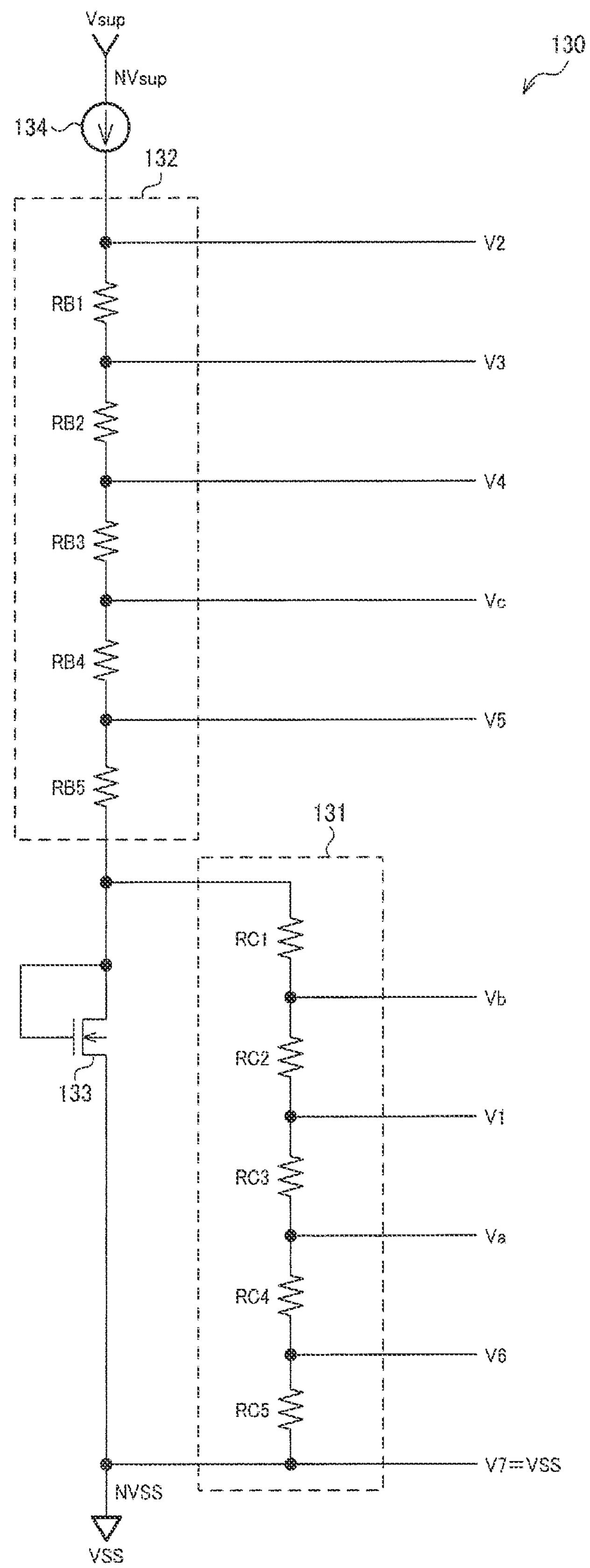
FIG. 5 is a detailed configuration example of a voltage generation circuit.

FIG. 5 is a detailed configuration example of the voltage generation circuit 130. The voltage generation circuit 130 includes a first voltage dividing circuit 131, a second voltage dividing circuit 132, an N-type transistor 133, and a current source circuit 134. The output transistor 110 is defined as a first N-type transistor, and the N-type transistor 133 is defined as a second N-type transistor.

The N-type transistor 133 is diode-coupled. That is, a gate and a drain of the N-type transistor 133 are coupled, and a source is coupled to the first power supply node NVSS. Accordingly, the drain of the N-type transistor 133 is in the vicinity of a threshold voltage of the N-type transistor 133. Since the N-type transistor 133 is formed by the same process as that of the output transistor 110, the drain of the N-type transistor 133 is in the vicinity of the threshold voltage of the output transistor 110.

The first voltage dividing circuit 131 is provided between the drain of the N-type transistor 133 and the first power supply node NVSS, and generates the first determination voltage Va, the second determination voltage Vb, the first gate drive voltage V1, the sixth gate drive voltage V6, and the seventh gate drive voltage V7 by dividing a voltage between a drain voltage of the N-type transistor 133 and the first power supply voltage VSS. Specifically, the first voltage dividing circuit 131 includes resistors RC1 to RC5 coupled in series. One end of each of the resistors RC1 to RC5 coupled in series is coupled to the drain of the N-type transistor 133, and the other end is coupled to the first power supply node NVSS. The second determination voltage Vb is output from a node between the resistor RC1 and the resistor RC2, the first gate drive voltage V1 is output from a node between the resistor RC2 and the resistor RC3, the first determination voltage Va is output from a node between the resistor RC3 and the resistor RC4, and the sixth gate drive voltage V6 is output from a node between the resistor RC4 and the resistor RC5. The seventh gate drive voltage V7 is output from the other end of each of the resistors RC1 to RC5 coupled in series. That is, the seventh gate drive voltage V7 is the first power supply voltage VSS. The magnitude relationship of the voltages is Vb>V1>Va>V6>V7.

Since the drain of the N-type transistor 133 is in the vicinity of the threshold voltage of the output transistor 110, the first determination voltage Va and the second determination voltage Vb are generated based on the threshold voltage. Accordingly, the first determination voltage Va and the second determination voltage Vb can be set in the vicinity of the threshold voltage of the output transistor 110, and as described with reference to FIG. 2, the temporal voltage change rate of the gate voltage Vgate in the vicinity of the threshold voltage can be controlled by using these determination voltages. There are various possible relationships between the first determination voltage Va, the second determination voltage Vb, and the threshold voltage of the output transistor 110, and for example, the second determination voltage Vb is set to be the same as the threshold voltage of the output transistor 110. The second determination voltage Vb may be substantially the same as the threshold voltage of the output transistor 110. However, the present disclosure is not limited thereto, and for example, the second determination voltage Vb and the first determination voltage Va may be set such that the threshold voltage of the output transistor 110 is between the second determination voltage Vb and the first determination voltage Va.

Since the N-type transistor 133 and the output transistor 110 are formed in the same process, the threshold voltage of the output transistor 110 and the threshold voltage of the N-type transistor 133 vary in the same tendency with respect to a process variation. Accordingly, the relationship between the first determination voltage Va, the second determination voltage Vb, and the threshold voltage of the output transistor 110 is less likely to be affected by the process variation, and the waveform forming less likely to be affected by the process variation is possible.

The second voltage dividing circuit 132 is provided between the drain of the N-type transistor 133 and the second power supply node NVsup, and generates the third determination voltage Vc, the second gate drive voltage V2, the third gate drive voltage V3, the fourth gate drive voltage V4, and the fifth gate drive voltage V5 by dividing a voltage between the drain voltage of the N-type transistor 133 and the second power supply voltage Vsup. Specifically, the second voltage dividing circuit 132 includes resistors RB1 to RB5 coupled in series. One end of the current source circuit 134 is coupled to the second power supply node NVsup, and the other end thereof is coupled to one end of each of the resistors RB1 to RB5 coupled in series. The other end of each of the resistors RB1 to RB5 coupled in series is coupled to the drain of the N-type transistor 133. The second gate drive voltage V2 is output from one end of each of the resistors RB1 to RB5 coupled in series. The third gate drive voltage V3 is output from a node between the resistor RB1 and the resistor RB2, the fourth gate drive voltage V4 is output from a node between the resistor RB2 and the resistor RB3, the third determination voltage Vc is output from a node between the resistor RB3 and the resistor RB4, and the fifth gate drive voltage V5 is output from a node between the resistor RB4 and the resistor RB5. The magnitude relationship of the voltages is V2>V3>V4>Vc>V5>Vb.

Similarly, since the third determination voltage Vc is also generated based on the threshold voltage, the relationship between the third determination voltage Vc and the threshold voltage of the output transistor 110 is less likely to be affected by the process variation, and the waveform forming less likely to be affected by the process variation is possible.

The voltages related to the falling of the output signal SQ is V2>V3>V4>Vc>Vb>V1>Va. Since V1>Va, the switch SW1 is turned on and the V1 is selected, so that the gate voltage Vgate reaches the Va. Since V2>Vb, the switch SW2 is turned on and the V2 is selected, so that the gate voltage Vgate reaches the Vb. Since V3>Vc, the switch SW3 is turned on and the V3 is selected, so that the gate voltage Vgate reaches the Vc. Further, when the switch SW4 is turned on and the V4 is selected, the gate voltage Vgate rises from the Vc to the V4, and then is maintained at the V4.

The voltages related to the rising of the output signal SQ is Vc>V5>Vb>Va>V6>V7=VSS. Since Vc>V5, the switch SW5 is turned on and the V5 is selected, so that the gate voltage Vgate reaches the Vc. Since Vb>V6, the switch SW6 is turned on and the V6 is selected, so that the gate voltage Vgate reaches the Vb. Since Va>V7, the switch SW7 is turned on and the V7 is selected, so that the gate voltage Vgate reaches the Va. Further, when the switch SW8 is turned on and the VSS is selected, the gate voltage Vgate decreases from the Va to the VSS, and then is maintained at the VSS.

Figure 6:
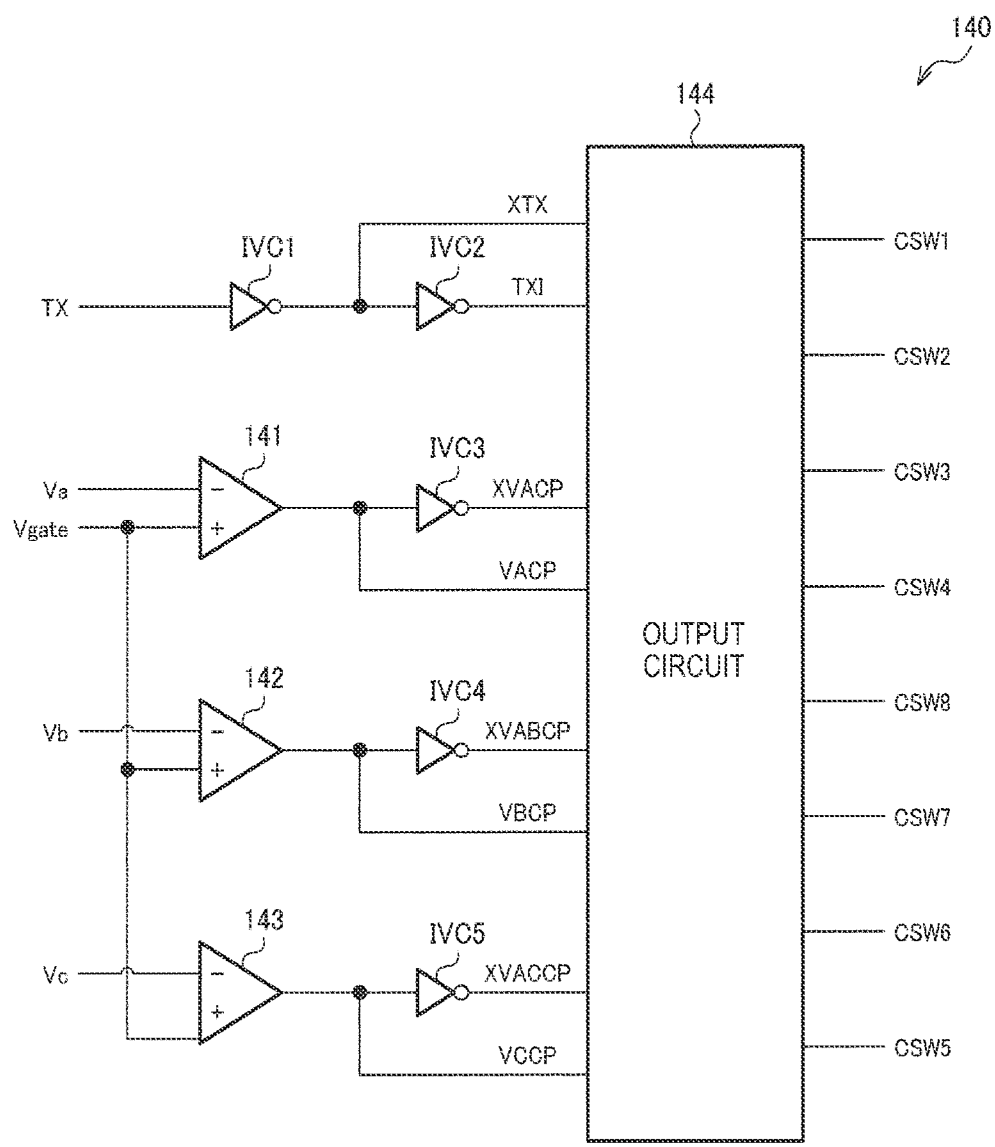
FIG. 6 is a detailed configuration example of a switch control circuit.

FIG. 6 is a detailed configuration example of the switch control circuit 140. The switch control circuit 140 includes the comparators 141 to 143, an output circuit 144, and inverters IVC1 to IVC5.

The comparator 141 determines whether the gate voltage Vgate is higher than the first determination voltage Va, and outputs the determination signal VACP which is a result of the determination. The comparator 142 determines whether the gate voltage Vgate is higher than the second determination voltage Vb, and outputs the determination signal VBCP which is a result of the determination. The comparator 143 determines whether the gate voltage Vgate is higher than the third determination voltage Vc, and outputs the determination signal VCCP which is a result of the determination.

The inverter IVC1 logically inverts the input signal TX and outputs a signal XTX which is a result thereof. The inverter IVC2 logically inverts the signal XTX and outputs a signal TXI which is a result thereof. The inverter IVC3 logically inverts the determination signal VACP and outputs a signal XVACP which is a result thereof. The inverter IVC4 logically inverts the determination signal VBCP and outputs a signal XVBCP which is a result thereof. The inverter IVC5 logically inverts the determination signal VCCP and outputs a signal XVCCP which is a result thereof.

The output circuit 144 outputs the control signals CSW1 to CSW8 based on the signal XTX, the signal XTI, the signal XVACP, the determination signal VACP, the signal XVBCP, the determination signal VBCP, the signal XVCCP, and the determination signal VCCP.

Figure 7:
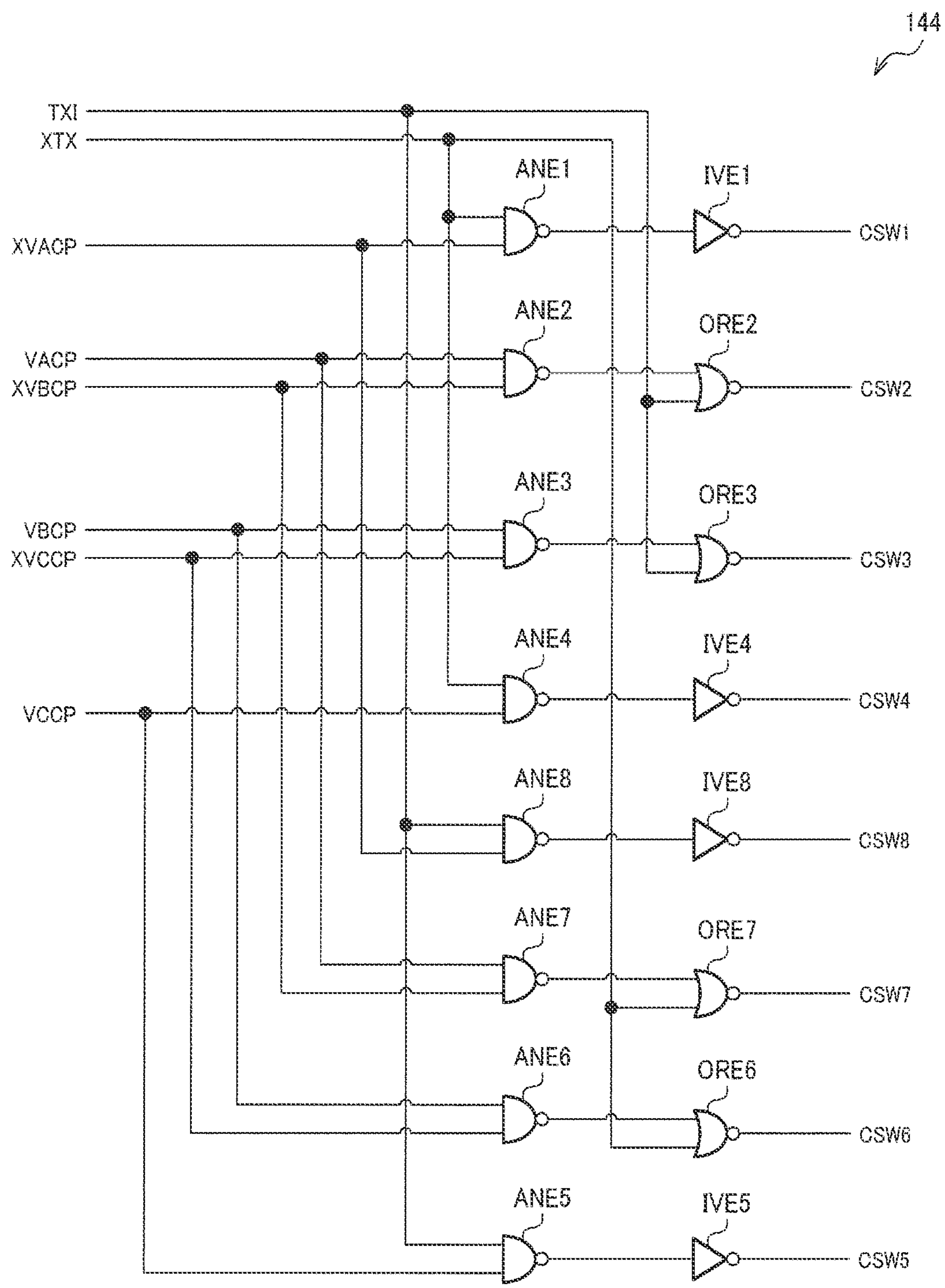
FIG. 7 is a detailed configuration example of an output circuit.

FIG. 7 is a detailed configuration example of the output circuit 144. The output circuit 144 includes AND circuits ANE1 to ANE8, an inverter IVE1, OR circuits ORE2 and ORE3, inverters IVE4 and IVE5, OR circuits ORE6 and ORE7, and an inverter IVE8.

When the signal XTX and the signal XVACP are at the high level, the inverter IVE1 outputs the control signal CSW1 at the high level. That is, when the input signal TX and the determination signal VACP are at the low level, the switch SW1 is turned on. When the signal VACP and the signal XVBCP are at the high level and the signal TXI is at the low level, the OR circuit OR2 outputs the control signal CSW2 at the high level. That is, when the input signal TX is at the low level, the determination signal VACP is at the high level, and the determination signal VBCP is at the low level, the switch SW2 is turned on. When the signal VBCP and the signal XVCCP are at the high level and the signal TXI is at the low level, the OR circuit OR3 outputs the control signal CSW3 at the high level. That is, when the input signal TX is at the low level, the determination signal VBCP is at the high level, and the determination signal VCCP is at the low level, the switch SW3 is turned on. When the signal XTX and the signal VCCP are at the high level, the inverter IVE4 outputs the control signal CSW4 at the high level. That is, when the input signal TX is at the low level and the determination signal VCCP is at the high level, the switch SW4 is turned on.

Similarly, when the input signal TX and the determination signal VCCP are at the high level, the switch SW5 is turned on. When the input signal TX is at the high level, the determination signal VCCP is at the low level, and the determination signal VBCP is at the high level, the switch SW6 is turned on. When the input signal TX is at the high level, the determination signal VBCP is at the low level, and the determination signal VACP is at the high level, the switch SW7 is turned on. When the input signal TX is at the high level and the determination signal VACP is at the low level, the switch SW8 is turned on. As described above, the output circuit 144 outputs the signal waveform of FIG. 4.

The circuit device according to the present embodiment described above includes the output terminal, the output transistor, and the gate voltage control circuit. The output transistor is provided between the first power supply node to which the first power supply voltage is supplied and the output terminal. The gate voltage control circuit is configured to receive the input signal and control the gate voltage of the output transistor. The gate voltage control circuit is configured to change the gate voltage at the first temporal voltage change rate after the input signal changes from the first logic level to the second logic level. After the gate voltage reaches the first determination voltage, the gate voltage control circuit changes the gate voltage at the second temporal voltage change rate smaller than the first temporal voltage change rate. After the gate voltage reaches the second determination voltage higher than the first determination voltage, the gate voltage control circuit changes the gate voltage at the third temporal voltage change rate greater than the second temporal voltage change rate.

According to the present embodiment, after the gate voltage reaches the first determination voltage and until the gate voltage reaches the second determination voltage, the gate voltage control circuit changes the gate voltage at the second temporal voltage change rate which is smaller than the first temporal voltage change rate and smaller than the third temporal voltage change rate. Accordingly, the change in the output signal output from the output transistor to the output terminal becomes gentle. Specifically, the corner at which the falling of the output signal is started can be rounded.

Further, in the present embodiment, after the gate voltage reaches the third determination voltage higher than the second determination voltage, the gate voltage control circuit may change the gate voltage at the fourth temporal voltage change rate smaller than the third temporal voltage change rate.

When the output signal reaches the first power supply voltage, the falling of the output signal is ended. According to the present embodiment, after the gate voltage reaches the third determination voltage, the temporal voltage change rate of the gate voltage is the gentle fourth temporal voltage change rate. Accordingly, when the output signal approaches the first power supply voltage, the temporal voltage change rate of the output signal is small, and the corner at which the falling is ended is rounded.

Further, in the present embodiment, the gate voltage control circuit may include the voltage generation circuit, the first switch and the first resistor, the second switch and the second resistor, the third switch and the third resistor, the first power supply switch and the first power supply resistor, the capacitor, and the switch control circuit. The voltage generation circuit may generate the first determination voltage, the second determination voltage, the first gate drive voltage between the first determination voltage and the second determination voltage, and the second gate drive voltage and the third gate drive voltage which are higher than the second determination voltage. The first switch and the first resistor may be coupled in series between the first node from which the first gate drive voltage is output and the gate of the output transistor. The second switch and the second resistor may be coupled in series between the second node from which the second gate drive voltage is output and the gate. The third switch and the third resistor may be coupled in series between the third node from which the third gate drive voltage is output and the gate. The first power supply switch and the first power supply resistor may be coupled in series between the first power supply node and the gate. One end of the capacitor may be coupled to the gate. The switch control circuit may control the first switch to the third switch and the first power supply switch to be turned on or off based on the input signal, the gate voltage, the first determination voltage, and the second determination voltage.

According to the present embodiment, when the switch control circuit turns on the first switch, the first gate drive voltage is output to the gate of the output transistor via the first resistor, and the capacitor is charged. At this time, the charge speed of the capacitor is determined by the first gate drive voltage and the resistance value of the first resistor. That is, the gate voltage changes at the first temporal voltage change rate. Similarly, when the switch control circuit turns on the second switch, the gate voltage changes at the second temporal voltage change rate, and when the switch control circuit turns on the third switch, the gate voltage changes at the third temporal voltage change rate. In this way, the temporal voltage change rate of the gate voltage is controlled depending on which switch is turned on.

Further, in the present embodiment, the resistance value of the second resistor may be greater than the resistance value of the first resistor. The resistance value of the third resistor may be smaller than the resistance value of the second resistor.

According to the present embodiment, the second temporal voltage change rate is smaller than the first temporal voltage change rate, and the third temporal voltage change rate is greater than the second temporal voltage change rate.

Further, in the present embodiment, when the input signal changes from the first logic level to the second logic level, the switch control circuit may switch the first power supply switch from on to off and switch the first switch from off to on. The switch control circuit may switch the first switch from on to off and switch the second switch from off to on when the gate voltage reaches the first determination voltage. The switch control circuit may switch the second switch from on to off and switch the third switch from off to on when the gate voltage reaches the second determination voltage.

According to the present embodiment, since the first switch is turned on when the input signal changes from the first logic level to the second logic level, the first gate drive voltage is output to the gate of the output transistor via the first resistor, and the gate voltage changes at the first temporal voltage change rate. Since the second switch is turned on when the gate voltage reaches the first determination voltage, the second gate drive voltage is output to the gate of the output transistor via the second resistor, and the gate voltage changes at the second temporal voltage change rate. Since the third switch is turned on when the gate voltage reaches the second determination voltage, the third gate drive voltage is output to the gate of the output transistor via the third resistor, and the gate voltage changes at the third temporal voltage change rate.

Further, in the present embodiment, the voltage generation circuit may generate the fourth gate drive voltage higher than the third determination voltage which is higher than the second determination voltage. The gate voltage control circuit may include the fourth switch and the fourth resistor coupled in series between the fourth node to which the fourth gate drive voltage is output and the gate.

According to the present embodiment, when the switch control circuit turns on the fourth switch, the fourth gate drive voltage is output to the gate of the output transistor via the fourth resistor, and the gate voltage changes at the fourth temporal voltage change rate.

Further, in the present embodiment, the resistance value of the fourth resistor may be greater than the resistance value of the third resistor.

According to the present embodiment, the fourth temporal voltage change rate is smaller than the third temporal voltage change rate. Accordingly, the gate voltage of the output transistor changes at the gentle temporal voltage change rate at the end of the falling of the output signal, and therefore the corner at which the falling of the output signal is ended is rounded.

Further, the switch control circuit may switch the third switch from on to off and switch the fourth switch from off to on when the gate voltage reaches the third determination voltage.

According to the present embodiment, since the fourth switch is turned on when the gate voltage reaches the third determination voltage, the fourth gate drive voltage is output to the gate of the output transistor via the fourth resistor, and the gate voltage changes at the fourth temporal voltage change rate.

Further, the circuit device according to the present embodiment may include the output resistor provided between the second power supply node to which the second power supply voltage higher than the first power supply voltage is supplied and the output terminal.

According to the present embodiment, the output circuit includes the output resistor provided between the second power supply node and the output terminal, and the output transistor provided between the output terminal and the first power supply node, and the output signal according to the gate voltage of the output transistor is output to the output terminal.

Further, in the present embodiment, the output transistor may be the first N-type transistor. The first determination voltage and the second determination voltage may be set based on the threshold voltage of the second N-type transistor.

According to the present embodiment, the threshold voltage of the output transistor and the threshold voltage of the second N-type transistor vary in the same tendency with respect to the process variation. Since the first determination voltage and the second determination voltage are set based on the threshold voltage of the second N-type transistor, the relationship between the threshold voltage of the output transistor, the first determination voltage, and the second determination voltage is less likely to be affected by the process variation. Accordingly, the waveform forming less likely to be affected by the process variation is possible.

Further, in the present embodiment, the first determination voltage and the second determination voltage may be set based on the drain voltage of the diode-coupled second N-type transistor.

The drain voltage of the diode-coupled second N-type transistor is in the vicinity of the threshold voltage of the second N-type transistor. Accordingly, the first determination voltage and the second determination voltage may be set based on the threshold voltage of the second N-type transistor.

Further, in the present embodiment, the output transistor may be the first N-type transistor. The voltage generation circuit may include the diode-coupled second N-type transistor, the first voltage dividing circuit, and the second voltage dividing circuit. The first voltage dividing circuit may be provided between the drain of the second N-type transistor and the first power supply node, and generate the first determination voltage, the second determination voltage, and the first gate drive voltage by dividing the voltage between the drain voltage of the second N-type transistor and the first power supply voltage. The second voltage dividing circuit may be provided between the second power supply node to which the second power supply voltage higher than the first power supply voltage is supplied and the drain of the second N-type transistor, and generate the second gate drive voltage and the third gate drive voltage by dividing the voltage between the second power supply voltage and the drain voltage of the second N-type transistor.

According to the present embodiment, the first determination voltage, the second determination voltage, the first gate drive voltage, the second gate drive voltage, and the third gate drive voltage can be generated based on the drain voltage of the second N-type transistor in the vicinity of the threshold voltage.

Although the present embodiment has been described in detail as described above, it will be readily apparent to those skilled in the art that many modifications may be made without departing substantially from novel matters and effects of the present disclosure. Therefore, all such modifications are intended to be included within the scope of the present disclosure. For example, a term cited with a different term having a broader meaning or the same meaning at least once in the present disclosure or in the drawings can be replaced with the different term in any place in the present disclosure or in the drawings. All combinations of the present embodiment and the modifications are also included in the scope of the present disclosure. Further, the configurations, operations, and the like of the circuit device and the like are not limited to those described in the present embodiment, and various modifications can be made.

What is claimed is:

1. A circuit device comprising:

an output terminal;

an output transistor provided between a first power supply node to which a first power supply voltage is supplied and the output terminal; and a gate voltage control circuit configured to receive an input signal and control a gate voltage of the output transistor, wherein the gate voltage control circuit is configured to change the gate voltage at a first temporal voltage change rate after the input signal changes from a first logic level to a second logic level, change the gate voltage at a second temporal voltage change rate smaller than the first temporal voltage change rate after the gate voltage reaches a first determination voltage, change the gate voltage at a third temporal voltage change rate greater than the second temporal voltage change rate after the gate voltage reaches a second determination voltage higher than the first determination voltage, and change the gate voltage at a fourth temporal voltage change rate smaller than the third temporal voltage change rate after the gate voltage reaches a third determination higher than the second determination voltage.

2. The circuit device according to claim 1, wherein the gate voltage control circuit includes:

a voltage generation circuit configured to generate the first determination voltage, the second determination voltage, a first gate drive voltage between the first determination voltage and the second determination voltage, and a second gate drive voltage and a third gate drive voltage which are higher than the second determination voltage;

a first switch and a first resistor coupled in series between a first node from which the first gate drive voltage is output and a gate of the output transistor;

a second switch and a second resistor coupled in series between a second node from which the second gate drive voltage is output and the gate;

a third switch and a third resistor coupled in series between a third node from which the third gate drive voltage is output and the gate;

a first power supply switch and a first power supply resistor coupled in series between the first power supply node and the gate;

a capacitor having an end coupled to the gate; and a switch control circuit configured to control the first switch to the third switch and the first power supply switch to be turned on or off based on the input signal, the gate voltage, the first determination voltage, and the second determination voltage.

3. The circuit device according to claim 2, wherein
a resistance value of the second resistor is greater than a resistance value of the first resistor, and
a resistance value of the third resistor is smaller than the resistance value of the second resistor.

4. The circuit device according to claim 2, wherein
the switch control circuit is configured to
switch the first power supply switch from on to off and switch the first switch from off to on when the input signal changes from the first logic level to the second logic level,
switch the first switch from on to off and switch the second switch from off to on when the gate voltage reaches the first determination voltage, and
switch the second switch from on to off and switch the third switch from off to on when the gate voltage reaches the second determination voltage.

5. The circuit device according to claim 2, wherein
the voltage generation circuit is configured to
generate a fourth gate drive voltage higher than a third determination voltage which is higher than the second determination voltage, and
the gate voltage control circuit includes:
a fourth switch and a fourth resistor coupled in series between a fourth node to which a fourth gate drive voltage is output and the gate.

6. The circuit device according to claim 5, wherein
a resistance value of the fourth resistor is greater than a resistance value of the third resistor.

7. The circuit device according to claim 5, wherein
the switch control circuit is configured to
switch the third switch from on to off and switch the fourth switch from off to on when the gate voltage reaches the third determination voltage.

8. The circuit device according to claim 1, further comprising:
an output resistor provided between a second power supply node to which a second power supply voltage higher than the first power supply voltage is supplied and the output terminal.

9. The circuit device according to claim 1, wherein
the output transistor is a first N-type transistor, and
the first determination voltage and the second determination voltage are set based on a threshold voltage of a second N-type transistor.

10. The circuit device according to claim 9, wherein
the second N-type transistor is diode-coupled, and
the first determination voltage and the second determination voltage are set based on a drain voltage of the diode-coupled second N-type transistor.

11. The circuit device according to claim 2, wherein
the output transistor is a first N-type transistor, and
the voltage generation circuit includes:
a diode-coupled second N-type transistor;
a first voltage dividing circuit provided between a drain of the second N-type transistor and the first power supply node, and configured to generate the first determination voltage, the second determination voltage, and the first gate drive voltage by dividing a voltage between a drain voltage of the second N-type transistor and the first power supply voltage; and
a second voltage dividing circuit provided between a second power supply node to which a second power supply voltage higher than the first power supply voltage is supplied and the drain of the second N-type transistor, and configured to generate the second gate drive voltage and the third gate drive voltage by dividing a voltage between the second power supply voltage and the drain voltage of the second N-type transistor.

12. A circuit device comprising:
an output terminal;
an output transistor provided between a first power supply node to which a first power supply voltage is supplied and the output terminal; and
a gate voltage control circuit configured to receive an input signal and control a gate voltage of the output transistor, wherein
the gate voltage control circuit is configured to
change the gate voltage at a first temporal voltage change rate after the input signal changes from a first logic level to a second logic level,
change the gate voltage at a second temporal voltage change rate smaller than the first temporal voltage change rate after the gate voltage reaches a first determination voltage, and
change the gate voltage at a third temporal voltage change rate greater than the second temporal voltage change rate after the gate voltage reaches a second determination voltage higher than the first determination voltage, wherein
the gate voltage control circuit includes:
a voltage generation circuit configured to generate the first determination voltage, the second determination voltage, a first gate drive voltage between the first determination voltage and the second determination voltage, and a second gate drive voltage and a third gate drive voltage which are higher than the second determination voltage;
a first switch and a first resistor coupled in series between a first node from which the first gate drive voltage is output and a gate of the output transistor;
a second switch and a second resistor coupled in series between a second node from which the second gate drive voltage is output and the gate;
a third switch and a third resistor coupled in series between a third node from which the third gate drive voltage is output and the gate;
a first power supply switch and a first power supply resistor coupled in series between the first power supply node and the gate;
a capacitor having an end coupled to the gate; and
a switch control circuit configured to control the first switch to the third switch and the first power supply switch to be turned on or off based on the input signal, the gate voltage, the first determination voltage, and the second determination voltage.

13. The circuit device according to claim 12, wherein
the gate voltage control circuit is configured to
change the gate voltage at a fourth temporal voltage change rate smaller than the third temporal voltage change rate after the gate voltage reaches a third determination voltage higher than the second determination voltage.

14. The circuit device according to claim 12, wherein
a resistance value of the second resistor is greater than a resistance value of the first resistor, and
a resistance value of the third resistor is smaller than the resistance value of the second resistor.

15. The circuit device according to claim 12, wherein
the switch control circuit is configured to switch the first power supply switch from on to off and switch the first switch from off to on when the input signal changes from the first logic level to the second logic level, switch the first switch from on to off and switch the second switch from off to on when the gate voltage reaches the first determination voltage, and switch the second switch from on to off and switch the third switch from off to on when the gate voltage reaches the second determination voltage.

16. The circuit device according to claim 12, wherein the voltage generation circuit is configured to generate a fourth gate drive voltage higher than a third determination voltage which is higher than the second determination voltage, and the gate voltage control circuit includes:

a fourth switch and a fourth resistor coupled in series between a fourth node to which a fourth gate drive voltage is output and the gate.

17. The circuit device according to claim 16, wherein a resistance value of the fourth resistor is greater than a resistance value of the third resistor.

18. The circuit device according to claim 16, wherein the switch control circuit is configured to switch the third switch from on to off and switch the fourth switch from off to on when the gate voltage reaches the third determination voltage.

19. The circuit device according to claim 12, further comprising:

an output resistor provided between a second power supply node to which a second power supply voltage higher than the first power supply voltage is supplied and the output terminal.

* * * * *